US010048291B2

(12) United States Patent
Fauveau

(10) Patent No.: US 10,048,291 B2
(45) Date of Patent: Aug. 14, 2018

(54) PIEZO SENSOR

(71) Applicant: Eric Fauveau, Baton Rouge, LA (US)

(72) Inventor: Eric Fauveau, Baton Rouge, LA (US)

(73) Assignee: ABB Inc., Cary, NC (US)

(*) Notice: Subject to any disclaimer, the term of this patent is extended or adjusted under 35 U.S.C. 154(b) by 603 days.

(21) Appl. No.: 14/264,451

(22) Filed: Apr. 29, 2014

(65) Prior Publication Data
US 2014/0232375 A1 Aug. 21, 2014

Related U.S. Application Data

(63) Continuation of application No. PCT/US2012/063710, filed on Nov. 6, 2012.

(60) Provisional application No. 61/560,848, filed on Nov. 17, 2011.

(51) Int. Cl.
G01R 5/28 (2006.01)
H04R 15/00 (2006.01)
G01R 3/00 (2006.01)
H04R 17/00 (2006.01)

(52) U.S. Cl.
CPC .............. G01R 5/28 (2013.01); G01R 3/00 (2013.01); H04R 15/00 (2013.01); H04R 17/00 (2013.01); Y10T 29/42 (2015.01)

(58) Field of Classification Search
CPC ........... G01R 5/28; H04R 15/00; H04R 17/00
USPC .............................. 324/109; 73/290 R, 290 V
See application file for complete search history.

(56) References Cited

U.S. PATENT DOCUMENTS

| 2,334,593 A | 11/1943 | Wyckoff |
| 2,474,693 A | 6/1949 | Rowe |
| 2,838,696 A | 6/1958 | Thurston |
| 3,154,946 A | 11/1964 | Ordorica et al. |
| 3,208,281 A | 9/1965 | Kalmus et al. |
| 3,225,312 A | 12/1965 | Tellerman |
| 3,286,190 A | 11/1966 | Hare |
| 3,290,649 A | 12/1966 | Whitehouse |

(Continued)

OTHER PUBLICATIONS

PCT Application No. US2012/063710; International Search Report for Applicant ABB, Inc. dated Feb. 25, 2013.

(Continued)

Primary Examiner — Walter L Lindsay, Jr.
Assistant Examiner — Milton Gonzalez
(74) Attorney, Agent, or Firm — Leydig, Voit & Mayer, Ltd.

(57) ABSTRACT

A piezo sensor having an inner conductor having an inner conductor segment, where the inner conductor segment forms a tubular sidewall having a break, and also having an interior surface and an exterior surface; a plurality of individually polarized piezoelectric members, each having an inner face and an outer face, and each inner face contacting the first conductor exterior surface, each piezoelectric member being adjacent to another on the exterior face of the inner conductor, forming sets of adjacent faces; an outer conductor having an outer conductor segment forming a tubular sidewall having a break, the outer conductor having an interior surface and an exterior surface, where the interior surface contacts the outer face of the piezoelectric members; and where the break of the outer conductor segment is alignable with adjacent faces of two of the plurality of piezoelectric members, and further being alignable with the break of the inner conductor segment.

6 Claims, 9 Drawing Sheets

(56) References Cited

U.S. PATENT DOCUMENTS

| | | | |
|---|---|---|---|
| 3,313,962 A * | 4/1967 | Sonderegger | G01L 1/16 |
| | | | 174/50.52 |
| 3,372,592 A | 3/1968 | Gravert | |
| 3,492,667 A | 1/1970 | Gratian | |
| 3,566,239 A | 2/1971 | Taniguchi | |
| 3,678,750 A | 7/1972 | DiNoia et al. | |
| 3,698,051 A * | 10/1972 | Miller | |
| 3,898,555 A | 8/1975 | Tellerman | |
| 3,982,144 A | 9/1976 | Rogers et al. | |
| 3,987,320 A | 10/1976 | Merhar | |
| 4,006,637 A | 2/1977 | Kinosita | |
| 4,028,619 A | 6/1977 | Edwards | |
| 4,071,818 A | 1/1978 | Krisst | |
| 4,158,964 A | 6/1979 | McCrea et al. | |
| 4,220,887 A * | 9/1980 | Kompanek | |
| 4,238,844 A | 12/1980 | Ueda et al. | |
| 4,304,126 A * | 12/1981 | Yelke | |
| 4,305,283 A | 12/1981 | Redding | |
| 4,344,068 A | 8/1982 | Thompson et al. | |
| 4,446,605 A * | 5/1984 | Molas | |
| 4,510,587 A | 4/1985 | Schneider | |
| 4,651,044 A | 3/1987 | Kompanek | |
| 4,652,786 A | 3/1987 | Mishiro | |
| 4,678,993 A | 7/1987 | Vinnemann et al. | |
| 4,709,210 A | 11/1987 | Pond | |
| 4,803,427 A | 2/1989 | Mason et al. | |
| 4,839,590 A | 6/1989 | Koski et al. | |
| 4,943,773 A | 7/1990 | Koski et al. | |
| 5,043,685 A | 4/1991 | Nyce | |
| 5,017,867 A | 5/1991 | Dumais et al. | |
| 5,020,035 A * | 5/1991 | Kompanek | |
| 5,049,776 A | 9/1991 | Ogawa | |
| 5,070,485 A | 12/1991 | Nyce | |
| 5,196,791 A | 3/1993 | Dumais | |
| 5,229,978 A * | 7/1993 | Flanagan | B06B 1/0655 |
| | | | 310/337 |
| 5,377,547 A | 1/1995 | Kusakabe et al. | |
| 5,473,245 A | 12/1995 | Silvus, Jr. et al. | |
| 5,681,986 A * | 10/1997 | Merk | |
| 5,804,961 A | 9/1998 | Castillo et al. | |
| 5,893,848 A * | 4/1999 | Negus | A61B 18/00 |
| | | | 606/1 |

OTHER PUBLICATIONS

PCT Application No. US2012/063710; International Preliminary Report on Patentability and Written Opinion of the International Searching Authority for Applicant ABB, Inc., et al. dated May 20, 2014.

* cited by examiner

FIGURE 1A
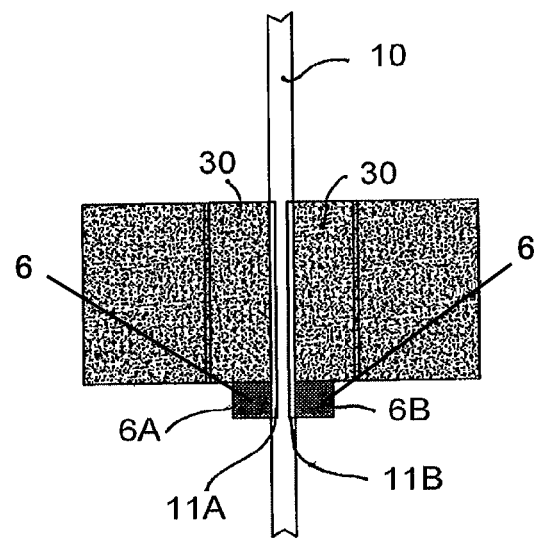
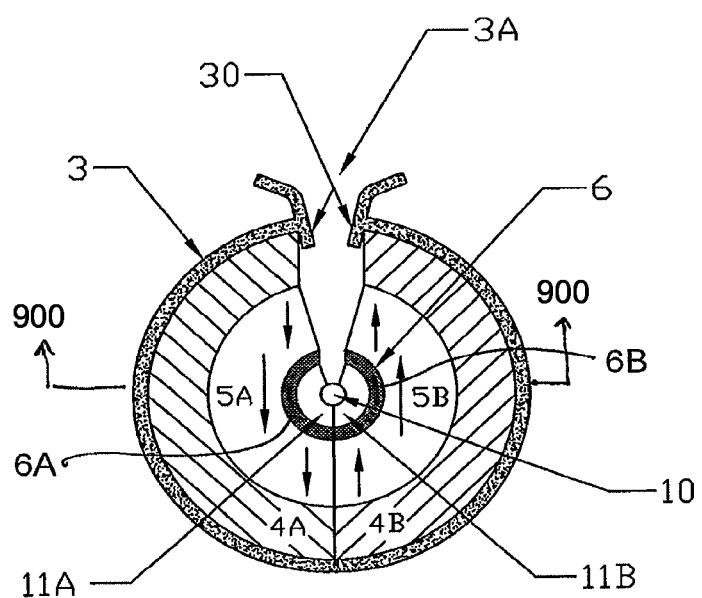
FIGURE 1

PIEZO SENSOR

PRIORITY CLAIM

This application is a continuation of PCT/US12/63710 filed on Nov. 6, 2011, which claims the priority benefit of U.S. provisional application No. 61/560,848 filed on Nov. 17, 2011, the contents of which are hereby incorporated by reference.

BACKGROUND OF THE INVENTION

1. Field of the Invention

The present invention relates generally to linear position transmitters that utilize a magnetostrictive wire to communicate the position of a magnet displaceable along the wire. The invention relates more specifically to an improved linear position transducer incorporating a magnetostrictive wire within which a torsional strain is detected by an improved piezoelectric sensor element.

2. Description of the Prior Art

Many systems for measuring liquid levels in storage tanks, as well as systems for measuring linear displacements for machine tools and the like, utilize a movable permanent magnet float or position indicator that surrounds a linearly oriented magnetostrictive wire. Typically the position of the permanent magnet, either in a float or as a horizontally translatable position indicator, represents the position of a monitored quantity of liquid or monitored position of an object of interest.

The use of the magnetostrictive principle involves the creation of an initial current pulse within a magnetostrictive wire to create a magnetic field along the length of the wire. That magnetic field interacts with the magnetic field that is present at the permanent magnet's location, resulting in a torsional disturbance in the wire. Because a torsional wave is essentially an acoustic wave, its speed of propagation is sufficiently slow and measurable that a direct relationship can be established between the time it takes for the wave to travel, and the distance traveled. When the end points of the wire are known and the initial start time for the torsional pulse is known, detection of the torsional pulse at a detector suitably positioned will provide a travel time value directly related to the distance traveled by the torsional pulse. This distance is then used to determine the level of a liquid within a tank or the position of a machine tool as it works an object of concern.

Use of the magnetostrictive principle in liquid level and positioning applications will typically take one of two forms. In each case, the principle involves the "interrogation" of the magnetostrictive wire with either an initial torsional pulse or an initial current pulse. In one method, a current pulse is directed through the magnetostrictive wire, thereby inducing a magnetic field around the wire. This electrically induced magnetic field interacts with the magnetic field established by the permanent magnet that is placed around the magnetostrictive wire, such as located in a float body. The interacting magnetic fields cause torsional forces that are translated into an acoustic/torsional wave in the magnetostrictive wire. Because the current pulse is essentially instantaneous (traveling at the speed of light), the start of the torsional wave can be considered as the start in time of the current pulse in the magnetostrictive wire. The torsional pulse, however, travels at the speed of sound in the wire, which is much slower and thus the time delay between the initial current pulse (the start of the torsional pulse) and the reception or detection of the torsional pulse at an end point of the magnetostrictive wire is measurable.

An alternative to the above method of utilizing the magnetostrictive principle involves imparting a torsional wave to the magnetostrictive wire, allowing it to travel down the wire to the point that it encounters the magnetic field created by the permanent magnet. The torsional motion of the wire within this magnetic field induces a current within the wire which immediately travels to the wire end points in a manner that can be detected. In either case, there is an exchange between electrical energy and mechanical energy and the appropriate detection of either electrical energy or torsional wave energy in response.

Electromagnetic sensors and piezoelectric sensors are used to detect current pulse at the end point in the magnetostrictive wire and the arrival of the torsional wave, respectively. Piezoelectric sensors have been shown to be most useful in accurately detecting and discriminating the arrival of the torsional pulse with an accuracy sufficient for many applications. In one configuration, two small plates of piezoelectric material, typically made up of one of a number of ceramic piezoelectric compositions, are bonded to diametrically opposed surfaces of the magnetostrictive wire. The opposite faces of these plates are then bonded to a housing or other stable mounting structure such that torsional movement of the magnetostrictive wire can be detected. Piezoelectric materials include certain ceramics, naturally occurring crystals, and man made crystals.

Piezoelectric sensors are useful in both methods of magnetostrictive application described above. The piezoelectric material (henceforth referred to as a piezo crystal) can be stimulated by an electric current to produce a torsional wave in the magnetostrictive wire or they may be used to convert a torsional wave detected in the wire into an electric signal that is used to terminate the measured time period of concern. The normal operational mode of piezoelectric sensors is in a shear mode, but certain longitudinal extensions can also be utilized. In some configurations, the piezoelectric materials are physically oriented and electrically connected so as to null certain common mode vibrations in the magnetostrictive wire. One device configuration used to distinguish the particular torsional pulse of interest from other acoustic and electrically induced wave elements within the magnetostrictive wire is described in U.S. Pat. No. 5,473,245, (the '245 patent) by reference. Described in this patent is a circular piezoelectric sensor which surrounds the magnetostrictive wire. The circular sensor is constructed from segments of piezo crystal, each being separately polarized. In the assembly, the polarization orientation more closely approximates a circumferentially polarized sensor, thereby providing a more discriminating sensor against extraneous signals. Unfortunately, the '245 piezo sensor is labor intensive to manufacture. The assembled piezo crystal elements must be machined to very close tolerances on both the inner annulus surface and the adjoining crystal faces. In order to provide a detector of sufficiently accurate character, extensive hand labor is needed to complete a multi-segmented piezo crystal sensor.

BRIEF DESCRIPTION OF THE FIGURES

FIG. 1 is a top view of one embodiment of a split sensor.

FIG. 1A is a side view of one embodiment of a split center depicting the broken sidewall.

DESCRIPTION

Figure 2:
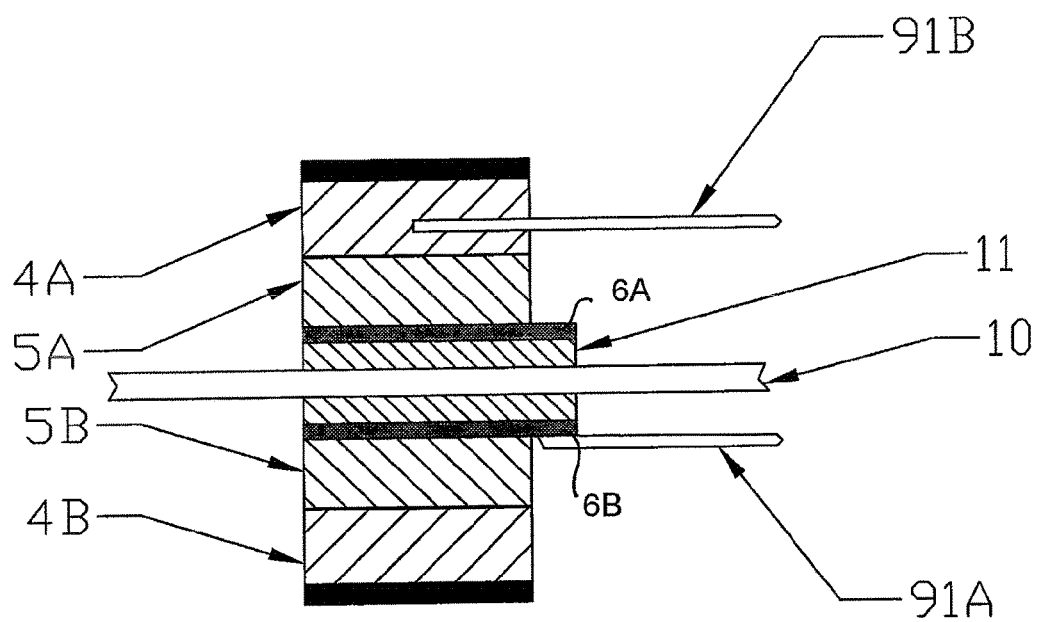
FIG. 2 is a cross section through arrows 900 of the embodiment of a split sensor in FIG. 1A.

One embodiment of a sensor is a split sensor shown in FIG. 1. As shown in FIG. 1, the assembled sensor is a "split" sensor, each interior component, other than the wire 10, forming a tubular sidewall (as shown a generally cylindrically or annularly shaped), open on the top and bottom of the tube structure, where the sidewall of the tubular structure is broken—that is, the sidewall is split—open on one side, from the top of the tube sidewall to the bottom of the tube sidewall, thereby providing access to the interior of the component through the sidewall of the component, such as through gap 3A (as opposed to accessing through the open bottom or top end of the tubular structure). As defined herein, a "broken tubular sidewall" or "tubular sidewall having a break" refers to a walled structure (such as a cylinder, rectangular, etc.) having a least one break in the sidewall along the length of the sidewall, forming an opening in the sidewall from the top to the bottom of the sidewall. An imaginary line drawn "around" the sidewall consequently would not be continuous.

The tubular sidewall preferably has an open top and bottom (as an example, an annular ring has an open top and bottom). As shown, the sensor 1 has an outer coupling band 3, outer conductor elements 4A and 4B (such as a brass or aluminum split ring), at least two separate piezo crystal elements 5A, 5B, and inner conductor elements 6A and 6B (such as aluminum, copper, etc.). As shown, the outer conductor and inner conductor are two element components (e.g., each forming a double broken tubular sidewall), but the conductors can also be a single broken sidewall as later described. Both inner conductor elements 6A and 6B, and outer conductor elements 4A and 4B, form an annular shaped cylinder, open on the opposing ends of the cylinder (e.g., top and bottom), and each conductor element has at least two faces that are opposed to the faces of the other respective element (e.g., the faces or edges of inner conductor element 6A that are opposed or adjacent to the faces or edges of the other inner conductor element 6B). Innermost to the completed assembly is a hollow center, to accommodate the magnetostrictive wire 10 and insulator 11. As shown, insulator is a two element component 11A and 11B, but may also be a single component, as later described.

The complete assembly, with insulator and wire, results in a series of nested components—conductors and piezo crystals, held in a contact relationship by the outer coupling band. The completed assembly (including insulator 11 and wire 10) is shown in cross section in FIG. 2, and in a side view in FIG. 1A. As can be seen in FIG. 1A, the broken sidewall components of the sensor are shown with the breaks aligned, allowing one to view the magnetostrictive wire in the center of the sensor through the sidewall components.

The completed sensor will surround the magnetostrictive wire 10. The sensor may be assembled with or without the insulator 11 as part of the completed sensor. As shown in FIG. 2, inner conductor 6 has a conductive lead 91A (such as a gold pin) attached thereto, such as with solder or conductive epoxy, or pressed into place, as does the outer conductor cylinder 4 (lead 91B, as shown in FIG. 2). Conductive lead 91A may be formed in the conductor, such as a conductor stamped from metal plate and bent into a circumferential shape.

As shown in FIG. 1, the outer coupling band 3 is a biasing ring or biasing cylinder (such as a snap ring) and may have slit or gap 3A in the sidewall of cylinder (such as a slot, thereby forming a broken tubular structure). Other types of coupling bands can be used, such as an encircling "hose" clamp, a helical spring or elastic O-ring. Outer coupling band 3 may be conductive, in which event the outer conductor 4 may be eliminated. With sufficient clamping force caused by the coupling band 3, each component of the sensor, interior of the coupling band, is held in good mechanical contact with the adjacent component thus providing the needed mechanical coupling in the complete magnetostrictive assembly between the wire, conductors and piezo crystals. Epoxy may be used as desired to fix the completed assembly elements together after the wire is coupled to the assembled sensor, in which event, the outer coupling band 3, if used, may be removed.

In the embodiment of FIG. 1, two piezo crystals are used, 5A and 5B, and hence, only two crystals have to be machined and polarized. Each crystal 5A and 5B forms a section of an annular cylinder. The piezo crystals, when positioned in the sensor, have at least one area of adjacent crystal faces that can form a gap or an opening between the crystals. Assembly of the device is greatly simplified, as one exemplary sequence demonstrates: a magnetostrictive wire 10 is surrounded by an insulating sleeve 11 (a one-piece insulator, for instance). Positioned around this insulated wire are the two inner conductor elements 6A and 6B, followed by the two piezo crystals 5A and 5B, over which are positioned the two components of the outer conductor, 4A and 4B. This creates a series of loose fitting nested components—wire, insulator, inner conductor, crystals, and outer conductor. Around this nested assembly is placed the outer coupling band 3, which provides a biasing inwardly directed force, thereby holding the competed assembly together with good mechanical contact of the interior nested components. Coupling band 3 may have inner extending retaining projections or ears 30 to maintain some of the components interior in a predetermined position and thus prevent rotational sliding of the contacted interior components (see, for instance, FIG. 1, where the outer conductor 4A and 4B is contacted by retaining projections 30).

Alternatively, and more preferred with the sensor assembly shown in FIG. 1, the sensor may be assembled without the magnetostrictive wire. Because each component interior to the outer coupling band 3, is a split assembly (as shown, two piece outer conductors 4A and 4B, two piece inner conductors 6A and 6B, and two piezo crystals), the wire can be inserted through the sidewall opening 3A of the assembled sensor and positioned innermost in the center opening. Preferably, the outer coupling band 3 will flex to accommodate insertion of the wire. Hence, the completed sensor may be assembled without a wire and stored for later assembly into a magnetostrictive device. When inserting the wire after sensor assembly, the opposing faces of the nested interior components (e.g., conductors, insulator and piezo elements and insulator) should align with the gap in the outer coupling band 3. With this alignment, the wire 10 can be slipped through the aligned opposing faces to the centermost position (much like inserting floss between teeth). See FIG. 1A. All nested components preferably are sufficiently stiff to flex open in response to insertion of the wire, and not collapse or fold on itself.

Alternatively, the sensor structure can be formed with all elements but the magnetostrictive wire 10 and insulator 11. In this instance, for final assembly, the insulator 11 may be slipped over the wire 10 (for instance, by using a one-piece cylindrically shaped insulator) and inserting the combined wire/insulator through the opening 3A in sidewall of the assembled sensor (aligning the "break" in each inner tubular structure with the gap 3A in the outer band). Finally, instead of snapping the wire in place through the sidewall of the sensor, the wire/insulator or wire alone may be threaded through the center of the assembly through the bottom (or top) opening of the competed assembly. This can be accomplished by slightly flexing open the coupling band 3, providing extra space in the center opening of the assembly to accommodate threading wire/insulator through the top or bottom opening of the sensor, instead of through the sidewall of the sensor (this method can also be used to insert the wire alone if the insulator is in placed in the assembled sensor).

Preferably after assembly, the two pieces of the inner conductor 6A and 6B are conductively coupled, at least along one set of opposing faces (in the embodiment shown in FIG. 1, there are the two sets of opposing faces of the outer conductor elements 4A and 4B). With a two element conductor, if a gap is present on both sets of opposing faces after assembly, a non-continuous "conductor" results. In this instance, at least one of the gaps should be conductively coupled in order to provide a continuous conductor. A conductive epoxy can be used to fill one of the gaps, or a conductive jumper may be used across one of the gaps. If epoxy is also used to join piezo crystals, a non-conductive epoxy preferably will be used to avoid conductively joining the inner conductor elements 4 and outer conductive elements 6 which would "short" out the assembled sensor.

Figure 3:
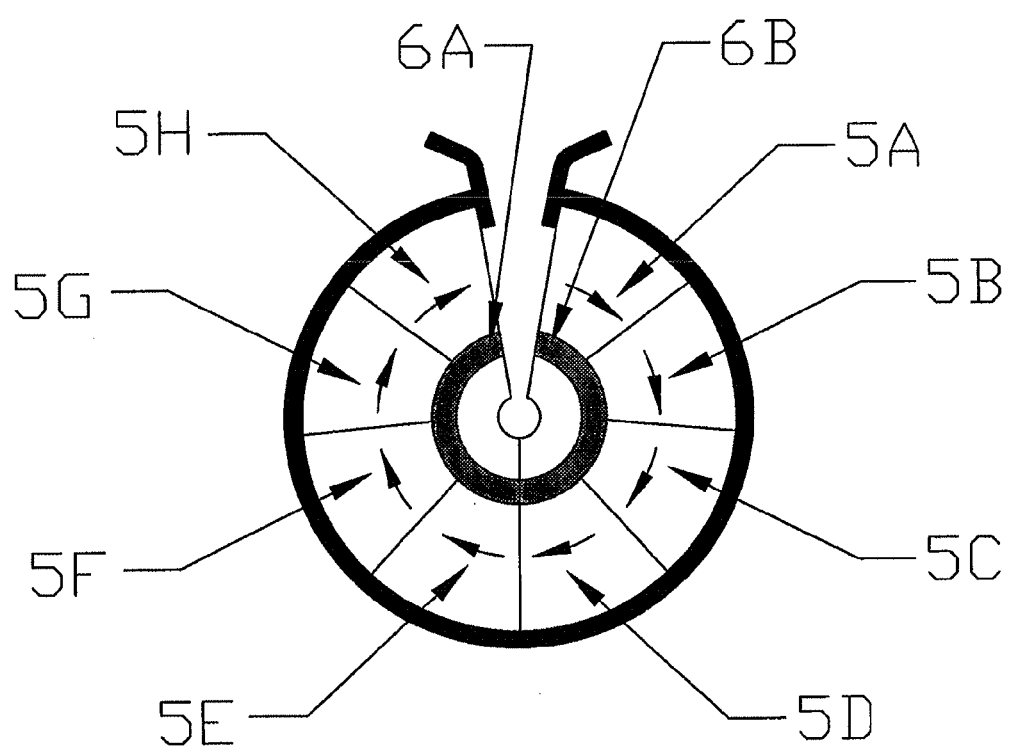
FIG. 3 is a top view of another embodiment of a split sensor.
Figure 5:
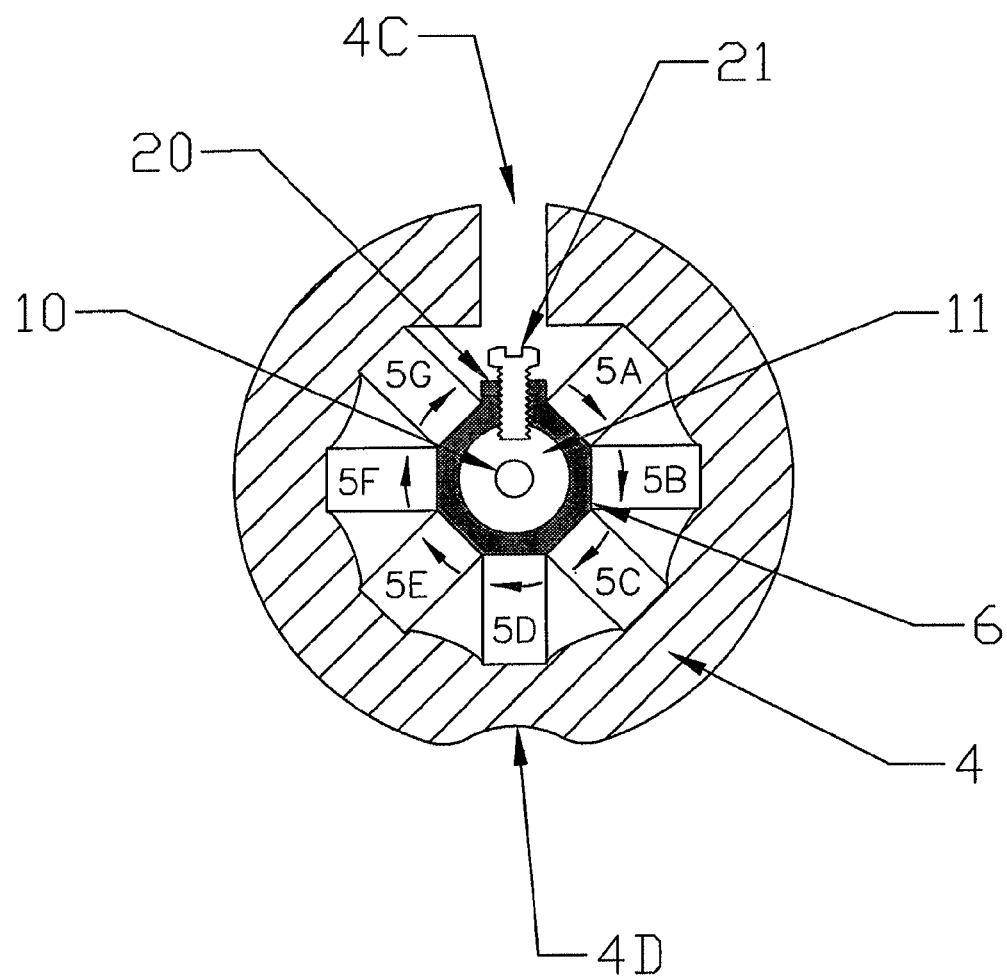
FIG. 5 is a top view of another embodiment of a split sensor.

As shown in FIG. 1, the nested components interior the outer band 3 are each two element components. Alternatively, each interior nested component, other than the piezo crystals, may be formed as a single broken tubular sidewall—(a single element component having a single break in the sidewall—that is, each element is a broken annulus), allowing the two opposing faces at the break to be further separated, (e.g., flexing the component open), or to be drawn closer (such as with outer biasing coupling band 3). See for instance, FIG. 5, showing the outer conductor 4 as a cylinder broken on one side. Construction materials should be sufficiently flexible to accommodate insertion of the wire (or wire and insulator) through the break or open side of each component. The flexibility needed is not great, as typical magnetostrictive wire thickness is 0.030 inches in diameter. A sensor constructed using broken annular conductors, or using two (or more) element conductors (such as shown in FIG. 1) are both considered as a split sensor, as at least one break is presented for wire insertion through the sidewall of the sensor. An alternative embodiment is to construct the coupling band 3 from conductive materials, thus eliminating the need for the outer conductor elements 4A and 4B. Such an embodiment is shown in FIG. 3.

The sensor element shown in FIG. 1 lacks the more complete circumferentially polarized segmented crystals as described in the '245 patent. A segmented piezo crystal can also be used in the split ring sensor, as shown in FIG. 3, with some (or none) of the segments joined crystals fixed together As depicted in FIG. 3, segments 5A-5D form one assembled piezo element with 5A-5D epoxied together, and 5E-5H form the other assembled piezo element with 5E-5H epoxied together.

Figure 4:
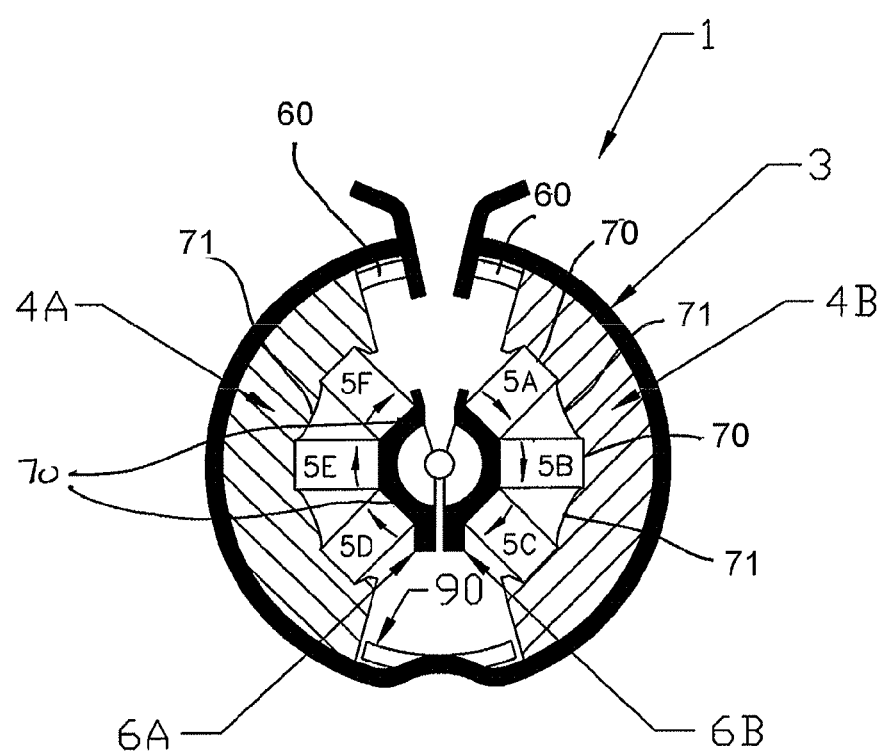
FIG. 4 is a top view of another embodiment of a split sensor.

To ease assembly of a piezo structure that more closely approaches circumferential polarization, an alternative embodiment is shown in FIG. 4. As shown, the sensor 1 has an outer coupling band 3, an outer conductor elements 4A and 4B, (such as a brass split ring), a series of shaped piezo crystals (shown are six crystals, 5A-5F), and inner conductor elements 6A and 6B. As can be seen, the piezo crystals are cubically shaped with rectangular or square faces. This shape is easier to form than are the conical shaped elements needed for the sensor shown in the '245 patent. Both the inner conductor elements 4 and outer conductor elements 6 are shaped to accommodate the piezo crystals in close mechanical contact. With "square" shaped crystal faces, the interior surface of the outer conductor 4, and the exterior surface of the interior conductor 6, have landing sites 70 formed to complement the shape of the piezo element surfaces that will seat in the respective landing site. As shown, the landing sites 70 are "flat" faces or "flats" to accommodate the square, flat seating face of the crystals. As shown in the outer conductor 4A and 4B, the landing sites 70 may be separated by slight protrusions 71 between the flats to maintain the piezo crystal in the desired landing site 70. With multiple crystals, a more nearly circumferentially polarized structure can thus be achieved, as shown by the arrows in FIG. 4 that represent crystal polarization. Also shown in FIG. 4 is conductive join 90 which conductively couples outer conductor elements 4A and 4B, and non-conductive spacers 60. Again, if the outer coupling band 3 is also a conductor, a separate outer conductor may be eliminated (or the jumper 90 may be dispensed with if a separate outer conductor is still desired). As described, "cylindrically shaped" includes geometric variations, such as octagonal, square or other shapes that form a sidewall (with or without breaks). As shown in FIG. 4, the individual piezo crystals are adjacent (but not necessarily touching) adjacent piezo crystals.

Because the inner conductor element 6 and outer conductor elements 4 are formed from more malleable materials such as brass, copper, or aluminum, it is easier to machine, form or stamp complex shape details in the conductors than in the piezo crystals. Hence, a suitable piezo crystal shape can be chosen, and the conductors formed to accommodate the selected piezo element shape. During assembly, the individual piezo crystals are place in the landing sites or flats of the inner conductor 6 (if present), and the outer conductor placed around crystals, with landing sites or flats on the outer conductor suitably aligned with the piezo element faces. The outer clamping band 3 is then positioned around the inner elements to form the assembled sensor.

Another embodiment of the sensor is shown in FIG. 5. In this embodiment, the outer conductor is a single element forming a broken annulus—that is, a cylindrical shaped sidewall with a single break. The resulting break or gap 4C in the sidewall allows for insertion of the wire through the break. The outer conductor 4 has a thinned area 4D opposed to the opening 4C. This thinned area acts has a hinge on the broken annulus (note, the inner conductor 6 may also be a such a hinged cylinder), allowing the outer conductor 4 to deform (open slightly) during placement of the conductor around the components interior, or upon insertion of the wire 10. With a thinned area 4D acting as a hinge, the outer conductor 4 is formed to be biased in the closed position, allowing the outer conductor 4 to also function as the outer coupling band 3. Other types of hinges could be deployed on the conductors, such as a pined hinge, and/or incorporating springs or biasing members as the non-conductor spaces 60 or conductive jumper 90 shown in FIG. 4 to push the elements circumferentially for good mechanical contact. If the conductors (either outer or inner) are constructed of sufficiently flexible material, a thinned area is optional, as the conductor itself will have enough "give" to allow placement of the wire through the aligned open faces after assembly.

FIG. 5 also shows another embodiment of the inner conductor 6. In this embodiment, the inner conductor 6 is a single continuous ring with a threaded opening 20 through the sidewall to accommodate a set screw. Note that this inner conductor is not a broken sidewall. To assemble the sensor and the wire, the magnetostrictive wire 10 and insulator 11 is threaded through the center top (or bottom) opening in the inner conductor 6, and a set screw 21 used to make good mechanical coupling between the inner conductor 6 and the insulated wire. The insulator 11 may be assembled with the wire (or dispensed with), or may be included in the sensor assembly prior to placement of the un-insulated wire. The remaining components of the sensor can assembled around the cylindrical inner conductor as previously described. Alternatively, the inner conductor 6 may be a hinged conductive member, described previously, with a set screw channel included elsewhere in the cylindrical wall of the conductor (not shown).

Figure 6:
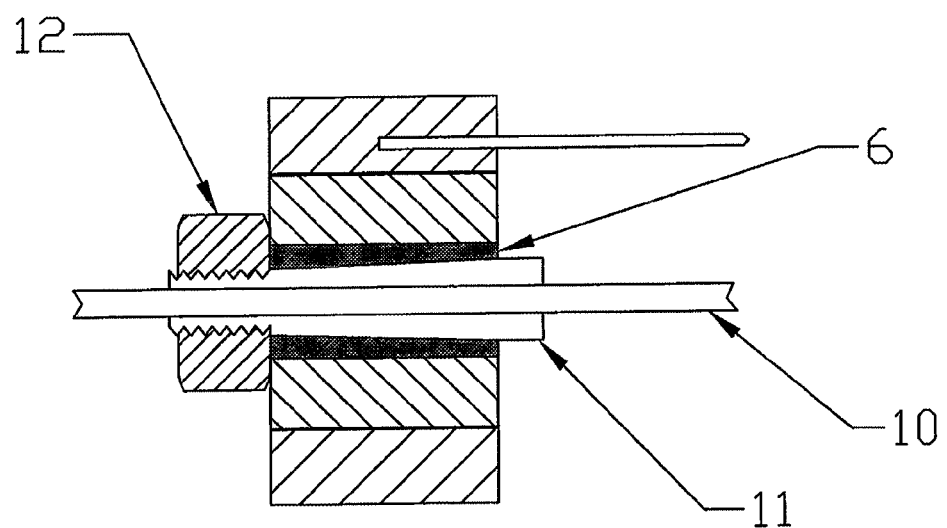
FIG. 6 is a cross section through one embodiment of the insulator and inner conductor.

Instead of a set screw to provide additional clamping force on the magnetostrictive wire, a "chuck" type arrangement can be used between the insulator, the wire, and the inner conductor. Shown in FIG. 6 is cross section is one such arrangement. As shown, insulator 11 is cone shaped and the inner conductor 6, surrounding the insulator 11, is similarly shaped on its interior surface (as before, the conductor 6 can be formed from multiple pieces or elements). In use, the conductor 6 is advanced up the insulator 11 (for instance, with a nut 12), forcing the conductor 6 into tight contact against the insulator 11, and hence, the insulator 11 against the wire 10, providing in a tight interference fit. Other means can be used to provide an interference fit, or to maintain the relative position of the inner conductor 6 and insulator 11, such as a retainer clip or band or other fastener means, including epoxy.

Figure 7:
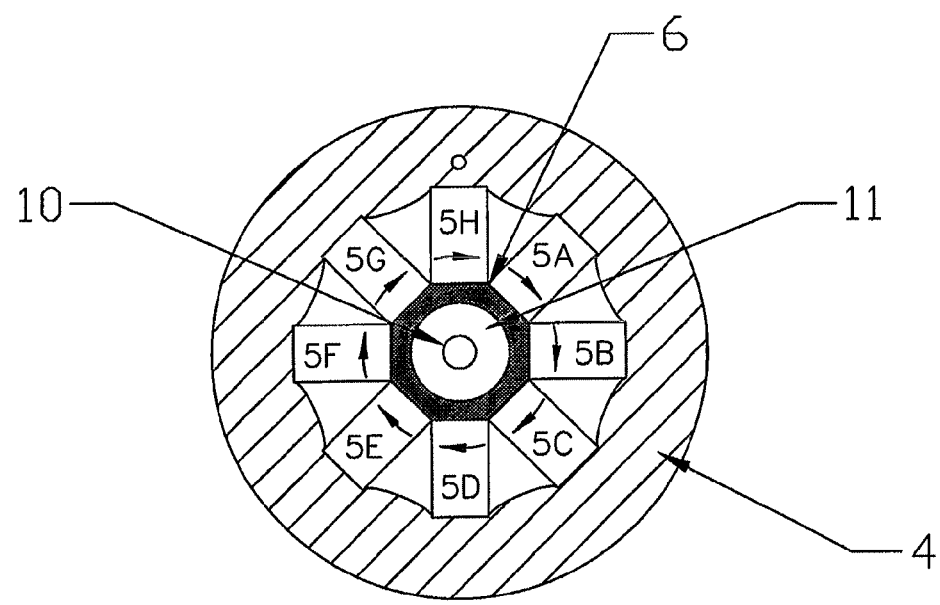
FIG. 7 is a top view of a non-split sensor employing separate piezo crystal elements.

Finally, a non-split sensor (e.g., sidewall is not broken) can be constructed, with a continuous ring shaped inner and outer conductor, using shaped conductors to accommodate a series of piezo crystals there between, such as in the arrangement depicted in FIG. 7. In this embodiment, the parts are assembled together and preferably joined using suitable epoxy after assembly to lock all the parts into a unitary structure rigid structure. A combination of broken tubular sidewall components with non-broken sidewall components can also be utilized.

Figure 8:
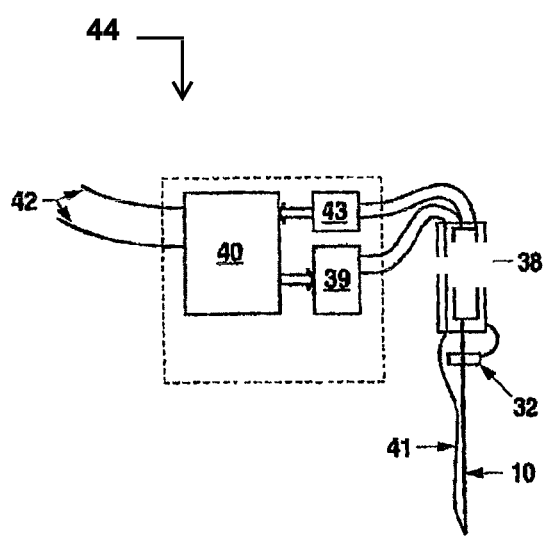
FIG. 8 depicts in block diagram the primary components of a magnetostrictive level detector.

Referring to FIG. 8, the primary components of a complete magnetostrictive level detector transmitter 44 are shown in block diagram form. Initially, pulsing circuit 39 sends a current pulse to magnetostrictive wire 10 with return wire 41 completing the circuit. The inner and outer conductors of the sensor establish an electrical connection between the piezoelectric elements 5 and the amplifier circuit 38 such that the voltage across the piezoelectric element 32 is amplified and processed through the microprocessor 40 after the level comparator circuit 43 compares levels between the start and end pulses, the microprocessor 40 controlling the output current in the instrumentation current loop 42. The transmitter output signal in the preferred embodiment ranges from 4 milliamps to 20 milliamps, although alternatively, any instrumentation current loop may serve as a power supply.

Figure 9:
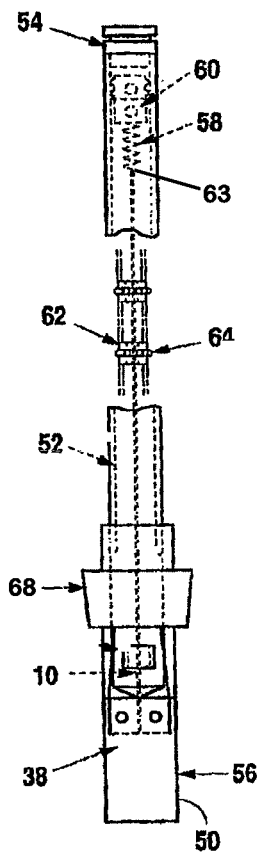
FIG. 9 is a front view of a level detector using an embodiment of the split sensor.

Reference is now made to FIG. 9 for a detailed description of a typical use of the piezoelectric sensor element described above. FIG. 9 discloses a level detector comprising a unitary sensor tube 50 that incorporates all of the necessary components for the incorporation of a magnetostrictive wire within either a liquid level transducer or a position transducer. Sensor tube 50 is an elongated cylindrical structure composed primarily of tube 52 and end pieces 54 and sensor holder 66. The primary functional component of sensor tube 50 is magnetostrictive wire 10 that stretches from end piece 54 through tube 52 to finally terminate at board 56. End piece 54 is welded to tube 52 and the preferred embodiment is sealed. Magnetostrictive wire 10 is attached to end piece 54 by way of spring 58 which is itself connected to board 60 and wire 63, which functions to complete the loop circuit for imparting the current flow in magnetostrictive wire 10. Magnetostrictive wire 10 may be held in a central position within tube 52 through the use of grommets 62 and "O" rings 64 placed at various intervals along tube 52 separating magnetostrictive wire 10 from an internal face of tube 52.

Tube 52 is welded to sensor holder 66 in a manner that closes off the external face of tube 52 from the sensor elements described below. Within sensor holder 66, magnetostrictive wire 10 is terminated in a manner similar to the termination at end piece 54 so as to ensure the ability to create a current flow in wire 10 for induction of a torsional wave front. Amplifier board 38 is shown as it would be positioned in sensor holder 66 to both terminate magnetostrictive wire 10 and to provide the circuitry necessary for amplifying the detected pulse.

Figure 10A:
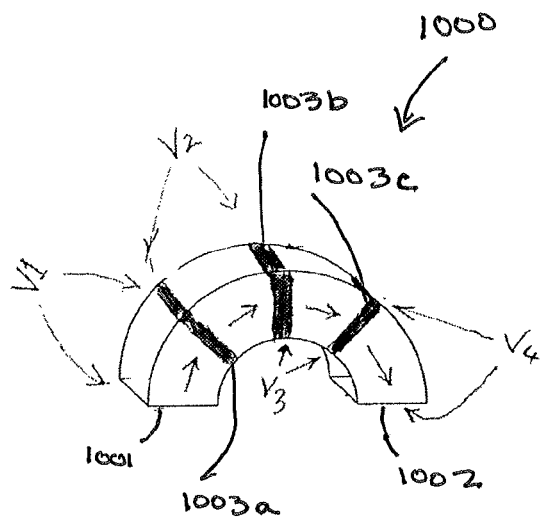
FIG. 10A depicts a perspective view of one embodiment of a polarization scheme for a half cylinder piezo crystal.
Figure 10B:
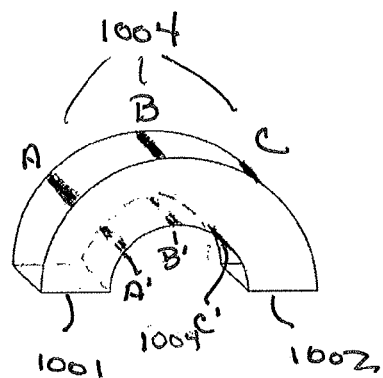
FIG. 10B depicts a perspective view of a second embodiment of a polarization scheme for a half cylinder piezo crystal.
Figure 10C:
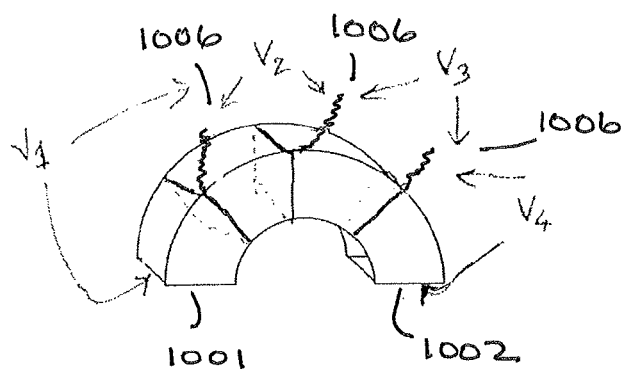
FIG. 10C depicts a perspective view of third embodiment of a polarization scheme for a half cylinder piezo crystal.

Another form of sensor that emulates a multiple element segmented sensor described above, is to separately polarize sections of a single piezo crystal. One technique to create a single piezo crystal or member that has differently polarized regions is shown in FIG. 10A. Shown in FIG. 10A is a half annulus piezo crystal 1000. The two end faces of the half annulus are each in contact with an electrode, 1001 and 1002, such as a plate that covers much of the end face. Spaced at intervals around the half annulus are electrodes 1003 that wrap around the annulus. Preferably, the wrapping electrodes follow a radial line. The embodiment shown in FIG. 10A has three banding or wrapping electrodes, 1003A, 1003B, and 1003C. More or less banding electrodes can be used. To polarize the crystal in FIG. 10A, a DC electric field is applied across selected pairs of electrodes, creating a potential difference across the selected electrodes—for instance, a first voltage is applied across electrodes 1001 and 1003A, thereby polarizing the region between these electrodes; then a voltage difference is applied across electrodes 1003A and 1003B (the voltage difference preferably will be similar if the distance between electrodes 1001 and 1003A is similar to that between electrodes 1003A and 1003B); then a voltage difference is applied between electrodes 1003B and 1003C, then 1003C and 1002, thereby selectively polarizing the regions between the specified electrodes. The voltages are sequentially applied, and hence sequentially polarizing the volume of the crystal between the pairs of electrodes. While it is preferred that the electric field be applied across adjacent electrodes, this is not required. For instance, a voltage difference can be applied across electrodes 1001 and 1003B, then across electrodes 1003A and 1003C, then across electrodes 1003B and 1002. The sequential polarization process as described uses a half annular crystal as shown in FIG. 10A, but the sequential polarization process can be applied to any crystal configuration, for instance, to a whole annular crystal which could be sequentially polarized using only a series of surrounding electrodes 1003. The surrounding electrodes can be as simple as a wire 1006 wrapped around the crystal, as shown in FIG. 10C, or instead of an electrode that wraps around the crystal, each electrode may be two strip electrodes 1004 positioned on opposing sides of the annulus. For instance, as shown in FIG. 10B, are six strip electrodes, 1004A, B and C positioned on the outer circumference of the annulus, and 1004A', B' and C' positioned on the inner circumference of the annulus, each running along "top to bottom" of the sidewall. Opposing electrodes (e.g., 1004A and 1004A') may be conductively linked to form one electrode upon application of the applied electric field (preferably, coupled in parallel), or may have voltages applied separately (sequentially or concurrently) across them (for instance, a first voltage V1 is applied across electrodes 1002 and 1004A and (or across 1004A and 1004B, etc.), and a second (preferably smaller) voltage V2 is applied across electrodes 1002 and 1004A' (or across 1004A' and 1004B', etc.).

It is also feasible to simultaneously polarize a crystal using multiple electrodes. For instance, in the half annulus crystal shown in FIG. 10A, if the applied potential difference across each set of adjacent electrodes represents a step down in applied voltages (for instance 400 kV V1 applied at electrode 1001; 350 kV V2 applied at electrode 1003A; 300 kV V3 applied to electrode 1003B; 250 kV V4 at electrode 1003C; and 200 k volts applied at electrode 1002, then the entire half annulus can be polarized in a single step (the delta between adjacent electrodes being equal at 50 kV, but the delta does not have be equal).

The invention is susceptible to considerable variation in its practice. Therefore, the foregoing description is not intended to limit, and should not be construed as limiting the invention to the particular embodiments presented herein. For instance, each conductor can be constructed from three of more conductively joined segments.

The invention claimed is:

1. A combination of a magnetostrictive wire and a piezo sensor, said piezo sensor comprising:
   an inner conductor comprising an inner conductor segment, said inner conductor segment forming a tubular sidewall having a break, and also having an interior surface and an exterior surface;
   a plurality of separate polarized piezoelectric members, each member having a polarization direction, each having an inner face and an outer face, said inner face of said polarized piezoelectric members contacting said inner conductor exterior surface, each of said plurality of piezoelectric members being adjacent another of said plurality of piezoelectric members on said exterior face of said inner conductor, thereby forming sets of adjacent faces, at least one set of said adjacent sets of adjacent surfaces forms a gap between the respective adjacent piezoelectric members of said at least one set;
   an outer conductor comprising an outer conductor segment forming a tubular sidewall having a break, said outer conductor having an interior surface and an exterior surface, said interior surface of said outer conductor contacting said outer face of each of said polarized piezoelectric members, said interior surface of said outer conductor segment facing said interior surface of said inner conductor segment; said piezo sensor having a hollow center portion interior to and contacting the inner conductor surface;
   said break of said outer conductor segment being alignable with said gap, and further being alignable with said break of said inner conductor segment, to thereby provide access to said hollow center portion through said aligned breaks of said outer conductor segment, said inner conductor segment and said gap; and
   said magnetostrictive wire positioned in and insulated in said hollow center portion of said piezo sensor.

2. The combination of claim 1, wherein said inner conductor is formed from at least two discrete segments, said discrete segments being electrically connected.

3. The combination of claim 1 wherein said piezo sensor, further comprises a broken outer coupling band contacting said outer conductor segment exterior surface, said broken outer coupling band adapted to apply an inward force on said outer conductor segments.

4. The combination of claim 1 wherein each of said adjacent surfaces in said adjacent sets being separated and not touching near said interior surface of said outer conductor, wherein said exterior surface of said inner conductor segment has a plurality of landing sites shaped to accommodate the inner face of said polarized piezoelectric members, and said interior face of said outer conductor segment has a plurality of landing sites shaped to accommodate said exterior face of said piezoelectric members, each of said plurality of said piezoelectric members positioned between said one of said landing sites on said outer conductor segment and one of said landing sites on said inner conductor segment.

5. The combination of claim 1, wherein said inner conductor segment comprises a split annular ring.

6. The combination of claim 1, wherein said broken outer coupling band comprises a broken cylindrically shaped sidewall defining an interior and an exterior, and said broken outer coupling band further comprises at least one projecting finger extending from said sidewall into said interior of said cylindrically shaped sidewall.

\* \* \* \* \*